US012610771B2

(12) United States Patent
Mittermayr et al.

(10) Patent No.: US 12,610,771 B2
(45) Date of Patent: Apr. 21, 2026

(54) TREATMENT DEVICE AND METHOD FOR THE TREATMENT OF SEMICONDUCTOR OBJECTS

(71) Applicant: siconnex customized solutions GmbH, Hof bei Salzburg (AT)

(72) Inventors: Moritz Mittermayr, Vorchdorf (AT); Bernhard Hammerl, Mondsee (AT); Christoph Unterberger, Fuschl am See (AT); Stefan Schorn, Abtenau (AT)

(73) Assignee: siconnex customized solutions GmbH, Hof bei Salzburg (AT)

( * ) Notice: Subject to any disclaimer, the term of this patent is extended or adjusted under 35 U.S.C. 154(b) by 172 days.

(21) Appl. No.: 18/422,101

(22) Filed: Jan. 25, 2024

(65) Prior Publication Data

US 2024/0258124 A1 Aug. 1, 2024

(30) Foreign Application Priority Data

Jan. 26, 2023 (AT) .............................. A 50043/2023

(51) Int. Cl.
*H01L 21/67* (2006.01)
*H01L 21/02* (2006.01)

(52) U.S. Cl.
CPC .. *H01L 21/67023* (2013.01); *H01L 21/02057* (2013.01)

(58) Field of Classification Search
CPC .................... H01L 21/67023; H01L 21/02057
See application file for complete search history.

(56) References Cited

U.S. PATENT DOCUMENTS

| | | | | |
|---|---|---|---|---|
| 5,468,302 A | * | 11/1995 | Thietje | .............. H01L 21/67023 134/1 |
| 6,021,791 A | * | 2/2000 | Dryer | ................. B01D 19/0031 134/102.1 |
| 6,171,975 B1 | * | 1/2001 | Hase | ................. H01L 21/67253 257/E21.228 |
| 11,358,253 B2 | | 6/2022 | Xu et al. | |
| 2004/0045592 A1 | | 3/2004 | Yamamoto | |
| 2004/0112410 A1 | | 6/2004 | Araki et al. | |
| 2005/0181226 A1 | | 8/2005 | Weidman et al. | |
| 2018/0281026 A1 | | 10/2018 | Toyomasu et al. | |
| 2019/0314951 A1 | | 10/2019 | Xu et al. | |

(Continued)

FOREIGN PATENT DOCUMENTS

| | | | |
|---|---|---|---|
| EP | 0903775 B1 | 12/2009 | |
| JP | 2000-124186 A | 4/2000 | |
| JP | 2008-078322 A | 4/2008 | |

(Continued)

*Primary Examiner* — P. Macade Nichols
(74) *Attorney, Agent, or Firm* — Collard & Roe, P.C.

(57) ABSTRACT

A treatment device and a method treat semiconductor objects with an aqueous treatment fluid. The treatment device has a treatment chamber and a supply device for supplying the treatment chamber with the aqueous treatment fluid. The supply device includes a chemical supply unit with at least two chemical containers and a water supply unit. At least one water line of the water supply unit and at least two chemical transport lines of the chemical supply unit are directly or indirectly connected with a single treatment fluid feed line. The single treatment fluid feed line is line-connected with the distribution device arranged in the treatment chamber.

18 Claims, 1 Drawing Sheet

(56)                     References Cited

U.S. PATENT DOCUMENTS

| | | | | |
|---|---|---|---|---|
| 2022/0134390 A1* | 5/2022 | Sawashima | ............. | B08B 13/00 |
| | | | | 134/57 R |
| 2022/0187856 A1 | 6/2022 | Toyomasu et al. | | |

FOREIGN PATENT DOCUMENTS

| | | | |
|---|---|---|---|
| JP | 2008-258437 A | 10/2008 | |
| KR | 10-2004-0036288 A | 4/2004 | |

* cited by examiner

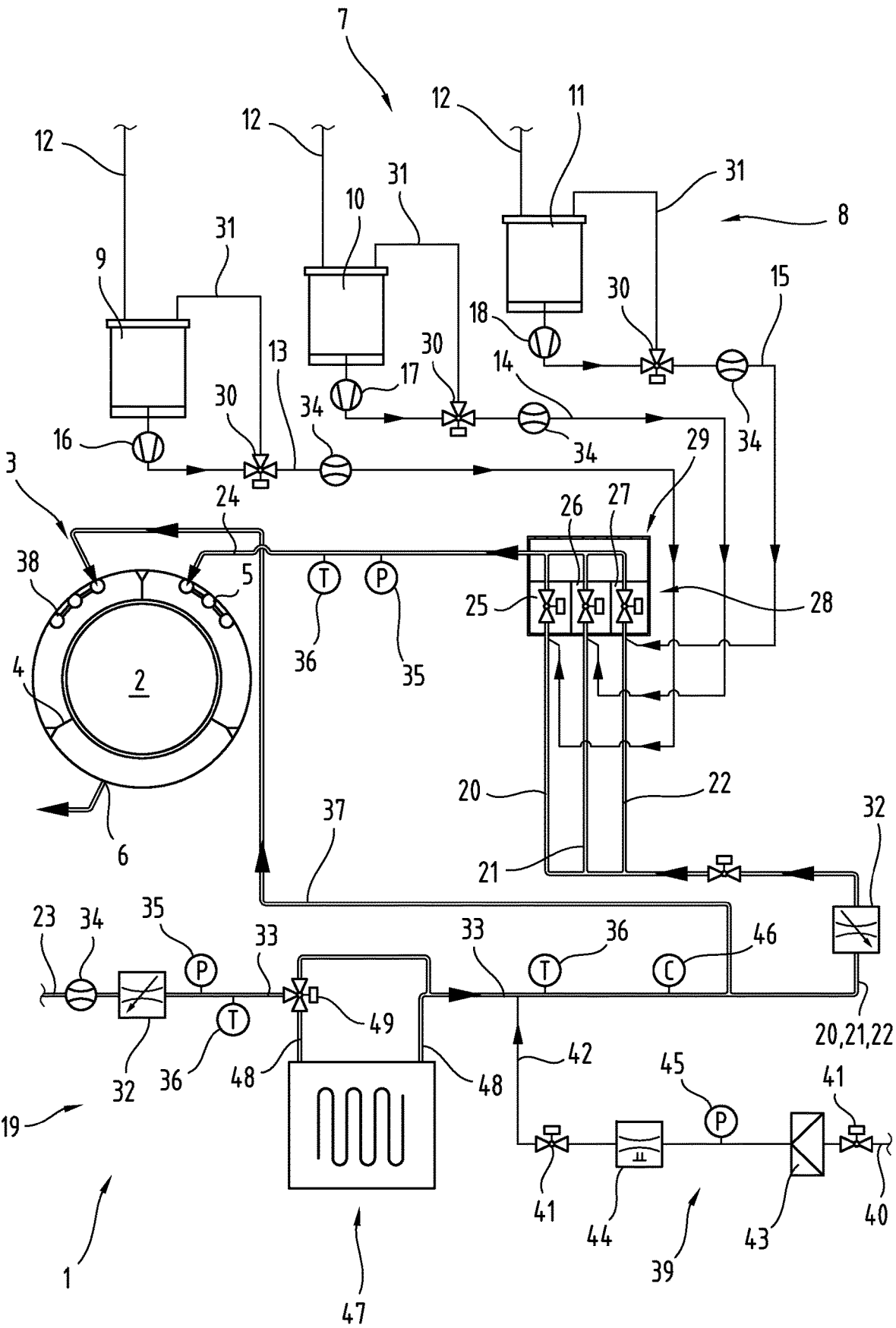

TREATMENT DEVICE AND METHOD FOR THE TREATMENT OF SEMICONDUCTOR OBJECTS

CROSS REFERENCE TO RELATED APPLICATIONS

Applicant claims priority under 35 U.S.C. § 119 of Austrian Application No. A50043/2023 filed Jan. 26, 2023, the disclosure of which is incorporated by reference.

BACKGROUND OF THE INVENTION

1. Field of the Invention

The invention relates to a treatment device and a method for the treatment of semiconductor objects, in particular semiconductor wafers, with an aqueous treatment fluid.

2. Description of the Related Art

As is known in the art, in the modern semiconductor industry semiconductor components are commonly produced in large quantities on semiconductor substrates, or wafers. To produce such semiconductor elements, a wafer surface is processed in a structured manner in a plurality of work steps. Very frequently used semiconductor technology process steps are, for instance, the application of (negative or positive) photoresists and their structured exposure to light (lithography or photolithography), separation or etching processes, doping, as well as mechanical processing steps such as polishing, etc. In very fundamental terms, such semiconductor technology process steps for producing semiconductor components are not restricted to semiconductor wafers, but rather differently configured semiconductor elements or objects can also be processed accordingly.

Naturally, at least some of these semiconductor technology process steps, such as mechanical polishing or an etching step, lead to the formation of undesired contaminations or residues on the surface of a semiconductor substrate or object. Cross-linked photoresists, for example, can also be left on the surface of a semiconductor object following an etching or additive separation step. A removal of such residues is essential for the performance of the subsequent work steps on the semiconductor objects, also due to the very high precision requirements in very small dimensions.

Such contaminations or residues caused by processing can be of many different types and such residues can contain a wide range of substances. In many cases, such residues are referred to as "polymeric" residues or simply "polymers" because they are often of a polymeric or at least oligomeric nature.

In most cases, to remove such residues, that is to say "polymeric" residues, a flushing of the semiconductor substrates or objects using additional cleaning chemicals is required because such residues from semiconductor processing steps are typically poorly or even not at all soluble in pure water. Often, it is also conducive to use several chemicals in doing so, which can be used either sequentially but in particular also simultaneously to flush semiconductor objects to remove disruptive residues. The specific requirements or the specific nature of the residues to be removed often also requires the use of very aggressive chemicals such as strong acids or strong oxidizing agents.

Nowadays, it is established practice when treating semiconductor objects between semiconductor technology processing steps to provide ready-mixed treatment chemical solutions in containers and to use them to flush semiconductor objects as required. This procedure can, however, be problematic in some respects.

For example, the use of pre-prepared, chemical-containing flushing solutions is restricted both with regard to the time and duration of flushing steps as well as with regard to the chemicals and chemical concentrations that can be used. In particular, the use of several chemicals at the same time is problematic because these chemicals and treatment chemicals are already very reactive in their pre-prepared spray or flushing solutions. That means that the effective concentration of such cleaning chemicals decreases rapidly in a short time, and thus such chemical mixtures can only be stored stably for very short time periods. In turn, this can mean that a large amount of no longer usable, undesired chemical waste collects which has to be disposed of at great cost.

A generic treatment device and a method for treating or cleaning semiconductor objects is disclosed by U.S. Pat. No. 11,358,253 B2, for instance. U.S. Pat. No. 11,358,253 B2 discloses a cleaning device for cleaning objects and a device for supplying this cleaning device with chemical fluids. Specifically, U.S. Pat. No. 11,358,253 B2 teaches the preparation of concentrated chemical solutions which are diluted with deionized water to form flushing solutions prior to being fed to the cleaning device. More precisely, U.S. Pat. No. 11,358,253 B2 teaches the splitting of a concentrated chemical solution from one container into two streams, the dilution of both streams with deionized water, and the feeding of the diluted flushing solutions into the cleaning device via different distributors or spray nozzles. A very similar device and a very similar device are also described in KR20040036288A, for instance.

SUMMARY OF THE INVENTION

The object of the present invention was to overcome the still existent disadvantages in the prior art and to provide a device and a method by means of which a highly efficient treatment or cleaning of semiconductor objects can be performed with improved flexibility and sustainability, however without high complexity and effort.

This object is solved by a device and a method according to the claims.

The treatment device according to the present invention is configured for the treatment or cleaning of semiconductor objects with an aqueous treatment fluid.

The device hereby comprises a treatment chamber with holding means arranged inside the treatment chamber to hold the semiconductor objects and with distribution means arranged in the treatment chamber to distribute the aqueous treatment fluid onto the semiconductor objects held in the treatment chamber.

Furthermore, the treatment device comprises a supply device to feed the distribution means in the treatment chamber with the aqueous treatment fluid.

This supply device in turn comprises a chemical supply unit with at least two chemical containers, configured for storing at least two different treatment chemicals or aqueous solutions of different treatment chemicals. A downstream chemical transport line is assigned to each of the chemical containers or the at least two chemical containers, along with a chemical conveying device for retrieving the treatment chemicals or the aqueous solutions of treatment chemicals.

Moreover, the supply device comprises a water supply unit for the provision of water, in particular deionized water, wherein the water supply unit has at least one water line for conducting water.

This at least one water line of the water supply unit along with the chemical transport lines or the at least two chemical transport lines of the chemical supply unit are connected directly or indirectly and/or via at least one openable and closable shut-off means with a single treatment fluid line, thereby forming a mixing unit. The single treatment fluid line is line-connected with the distribution means arranged in the treatment chamber in order to feed the aqueous treatment fluid into the treatment chamber.

The term "line-connected" is understood here and in the following as any direct or indirect line connection of elements, such as directly leading into one another or indirectly via separate connection lines.

These features allow for a treatment device to be operated with improved efficiency, sustainability and flexibility, in particular regarding the chemicals that can be used. The composition of the aqueous treatment fluid and the amount of treatment or cleaning chemicals it contains can be flexibly adjusted to the respective requirements of a treatment or flushing process. Advantageously, a respective chemical composition of the aqueous treatment fluid for a treatment or flushing process can be freely selected, and at the same time the treatment chemicals or aqueous solutions of treatment chemicals can nevertheless be stored or stockpiled with long-term stability. Furthermore, a risk of contamination for a certain aqueous treatment fluid can be effectively prevented because an aqueous treatment fluid with a certain chemical composition is only used once.

In addition, treatment processes can also be carried out with improved time efficiency because several chemicals or treatment chemicals can be used simultaneously for a certain treatment process and several, sequential treatment and flushing processes can be avoided. The overall duration for the treatment or cleaning of a batch of semiconductor objects such as wafers can hereby be advantageously kept short. On the other hand, a process duration for a flushing or treatment process can be freely selected because any of the treatment chemicals or aqueous solutions of chemicals can be retrieved from the chemical containers and be used to form the aqueous treatment fluid.

Moreover, it can also be ensured that the treatment chemicals contained in the aqueous treatment fluid are well and homogeneously mixed prior to being introduced or distributed into the treatment chamber, such that all of the semiconductor objects held in the treatment chamber can be chemically treated or cleaned in the same manner. Irregularities in the treatment of individual semiconductor objects can thus be prevented, such that on the one hand a risk of individual semiconductor objects being excluded due to low treatment intensity can be prevented, and on the other hand an increased duration of a treatment process for the purposes of ensuring sufficient treatment or cleaning intensity for all semiconductor objects in the treatment chamber can be avoided.

The treatment chamber can fundamentally be configured in any way, insofar as the respective configuration allows for holding and treating semiconductor objects. If the semiconductor objects are configured as wafers, for example, the treatment chamber can, as is common in the art, be configured as a rotor which is rotatable around a rotation axis in order to achieve as even a distribution of the aqueous treatment fluid on the semiconductor objects or wafers as possible. The holding means can, as is also known in the art, be formed by holding rails with grooves for holding the semiconductor objects or wafers. The distribution means can, for instance, be formed by a plurality of line-connected spray nozzles or sprinklers which can be supplied with a respective aqueous treatment fluid via the single, shared treatment fluid feed line. It is entirely possible for several such line-connected spray nozzles to be arranged as distribution means in the treatment chambers, for instance as spray nozzle rows. These distribution means can then each be line-connected via separate feed lines with the single, shared treatment fluid feed line in order to supply each of the distribution means with treatment fluid.

Furthermore, the treatment chamber can have other additional distribution means which can be connected with a separate water feed line for feeding in the water provided by means of the water supply unit, in particular deionized water. This enables a flushing of the semiconductor objects with pure, in particular deionized water between or after one or more treatments with one or more aqueous treatment fluids. In addition, the treatment chamber can, as usual, have a drain or several drains to drain fluids out of the treatment chamber after their application to the semiconductor objects.

The at least two chemical containers can be configured with supply lines for feeding in the respective treatment chemicals or aqueous solutions of treatment chemicals, where said supply lines can be connected with external provision devices for the chemicals or treatment chemicals or aqueous solutions of treatment chemicals.

Similarly, the water supply unit can be connected with an external water supply means for highly pure water, in particular deionized water. The water supply unit can have a water pump for conveying the water in the water line(s). Alternatively, however, the external water supply means can prime the water at a pre-pressure, for instance by means of an external water pump, such that a water pump is rendered superfluous for the water supply unit of the treatment device.

The respective chemical conveying devices assigned to a chemical container can be predominantly configured as chemical pumps. Nonetheless, in very fundamental terms, a different configuration of the chemical conveying devices is also conceivable, for instance as Venturi nozzles. A pressurization of the chemical containers, such as with gas, is also fundamentally possible for transporting the treatment chemicals or aqueous solutions of treatment chemicals, such that the chemical conveying devices can also be formed by corresponding pressurization means. Ultimately, the chemical conveying devices have to allow for transporting or conveying the treatment chemicals or aqueous solutions of treatment chemicals through the chemical transport lines.

Furthermore, flow control means and flow monitoring means or flow sensors can be arranged in the at least two chemical transport lines and the at least one water line. For example, the at least two chemical conveying devices of the chemical supply unit can be configured as flow adjustable, such as speed variable, chemical pumps. Alternatively, dedicated flow control means such as flow control valves can be arranged both in the at least two chemical transport lines and/or the at least one water line. Corresponding mixture ratios and chemical concentrations of an aqueous treatment fluid introduced into the treatment chamber can be configured individually prior to introduction. The respective media flows, i.e. the flow rates of the treatment chemicals or aqueous solutions of treatment chemicals and of the water, as well as the flow rate of the aqueous treatment fluid through the single treatment fluid feed line, are thus freely selectable parameters and can be selected depending on the circumstance or cleaning requirement.

All present electronically controllable control and process monitoring means, such as pumps, valves and sensors of the treatment device, can of course have a signal technology connection with an electronic control device, thus enabling automatic control of the treatment device.

According to a further embodiment of the treatment device, it can be provided that the water supply unit has at least two water lines connected to the mixing unit, wherein each of the water lines is connected with at least one chemical transport line upstream of the connection with the single treatment fluid feed line.

During operation of the treatment device, these features enable the production of separate, diluted solutions of the treatment chemicals prior to the combination of these aqueous solutions to form the aqueous treatment fluid. Fast kinetic reactions of the treatment chemicals with one another can advantageously be at least delayed prior to introduction into the treatment chamber.

According to a further embodiment of the treatment device, it can be provided that the chemical supply unit comprises at least three chemical containers.

Specifically, this can allow for an increased number of chemicals or treatment chemicals to be provided for a treatment of the semiconductor objects, thus increasing flexibility during operation of the treatment device.

For example, for the specific treatment of semiconductor objects between work steps, it can be expedient if a first chemical container is configured for storing concentrated sulfuric acid, a second chemical container is configured for storing hydrogen peroxide, and a third chemical container is configured for storing diluted hydrofluoric acid.

The storage of these treatment chemicals or aqueous solutions of treatment chemicals is useful because a multitude of treatment and flushing processes following work steps such as etching steps can be covered with these treatment chemicals or aqueous solutions of treatment chemicals and combinations thereof with one another. For instance, the use of an aqueous treatment fluid comprising a combination of hydrogen peroxide and sulfuric acid has proven efficient for many treatment steps and flushing processes.

Preferably, an embodiment of the treatment device can also be provided in which in the mixing unit each water line connected to the mixing unit or the at least two water lines connected to the mixing unit each leads into an openable and closable shut-off means, said shut-off means being line-connected with one another downstream such that the shut-off means form a shut-off block, wherein the single treatment feed line is line-connected with this shut-off block.

This is advantageous on the one hand because a diluted, aqueous solution can be fed quickly and precisely into the mixing unit. On the other hand, diluted solutions fed to the mixing unit or its shut-off block can be convectively fluidized and thus pre-mixed or homogenized. That can in turn ensure that all semiconductor objects in the treatment chamber are evenly treated with an aqueous treatment solution with homogeneously admixed treatment chemicals. The at least two chemical transport lines of the chemical supply unit can, for example, also each lead to one of the shut-off means.

In this regard it can, however, also be advantageous if a number of the water lines connected to the mixing unit equals the number of chemical transport lines connected to the mixing unit, wherein in the mixing unit only one chemical transport line leads to exactly one of the water lines connected to the mixing unit.

In other words, it can be provided that upstream of the connection with the single treatment fluid feed line, one each of the chemical transport lines leads into exactly one of the water lines in such a way that multiple chemical transport lines do not lead into the same water line. Above all, these features can provide a further improved, precisely controlled production of the aqueous treatment fluid for the treatment of the semiconductor objects in the treatment chamber. A respective chemical transport line can hereby lead into exactly one of the water lines upstream of the aforementioned shut-off block.

According to a further embodiment of the treatment device, it can be provided that the supply device further comprises a dosing unit for the dosed feeding of carbon dioxide gas into at least one water line leading to the mixing unit.

During operation of the treatment device, this provides the advantage that especially due to the resulting carbon dioxide, the water and the aqueous treatment fluid can be rendered less corrosive and thus at least a certain degree of corrosion protection can be provided for the wafers. Moreover, as long an operating life as possible without the need to service the treatment device can thereby be guaranteed, or service intervals extended.

In addition, a further embodiment of the treatment device in which the water supply unit further comprises a heating device for heating the water, in particular the deionized water, can be advantageous.

A desired working temperature can hereby be conferred upon the aqueous treatment fluid, but also, for instance, upon the flushing water fed separately into the treatment chamber, in particular deionized flushing water. It is hereby advantageous, for example, that cleaning processes can be accelerated due to an increased temperature, thereby allowing shorter treatment and flushing processes and thus shorter treatment durations. For instance, a heating device can be arranged in a bypass line of the water supply unit running parallel to a main water line wherein a 3-way switching means or valve, or a 3-way control means or valve can be arranged in the main water line, thereby enabling a targeted re-routing of the added water, in particular the deionized water, via the heating device to heat the water. Alternatively, it is of course possible to use combinations of two 2-way switching means, in particular 2-way control means, instead of 3-way variants. If control means or valves are arranged, only a partial amount of the water supplied to the water supply unit can be heated by the heating device arranged in the bypass line during operation of the treatment device.

According to a further, preferred embodiment of the treatment device, it can be provided that the at least two chemical containers each have a 3-way switching device and each have a bypass line returning to or leading back into the respective chemical container assigned to them.

These features of the treatment device primarily enable a very fast or quickly controllable feeding of the treatment chemicals or aqueous solutions of the treatment chemicals into the mixing unit. During operation of the treatment device, a very fast provision of a treatment chemical for the production of the aqueous treatment fluid can thereby be achieved as a further result, and it is therefore also possible to switch very quickly from one composition of an aqueous treatment fluid to a treatment fluid with another composition or to other treatment chemicals. That is possible because the individual treatment chemicals or aqueous solutions of treatment chemicals are already in flow and do not have to first be put into circulation. For instance, a 3-way switching device can be implemented using a 3-way switching means or valve or a combination of two 2-way switching means or valves, with one 2-way switching means in the chemical transport line and one 2-way switching means in the bypass line which leads back to a chemical container. In particular, 3-way switching devices can be formed by 3-way control valves or combinations of two 2-way control valves in order to enable control of the respective flow or the quantity supplied to the mixing unit via the chemical transport lines.

The object of the invention is, however, also solved by a method for treating semiconductor objects with an aqueous treatment fluid.

The Method Comprises the Following Steps:

Storage of at least two different treatment chemicals or aqueous solutions of different treatment chemicals in at least two correspondingly configured chemical containers of a chemical supply unit.

Furthermore, provision of water, in particular of deionized water via a water supply unit. At least one water line of the water supply unit is thereby connected to a mixing unit of the supply device, and the water of the mixing unit is fed to or into the mixing unit by means of this at least one water line connected to the mixing unit.

A further method step performed, in particular simultaneously with the supply of water to the mixing unit, is a retrieval of the at least two treatment chemicals or aqueous solutions of treatment chemicals from the at least two chemical containers and feeding of the at least two treatment chemicals or aqueous solutions of treatment chemicals to the mixing unit by means of at least two chemical transport lines and at least two chemical conveying devices, said at least two chemical transport lines each being assigned upstream to the at least two chemical containers, and said at least two chemical conveying devices each being assigned to the at least two chemical containers.

Furthermore, through feeding the water and the at least two different treatment chemicals or aqueous solutions or different treatment chemicals, formation of the aqueous treatment fluid by combining the at least two treatment chemicals or aqueous solutions of treatment chemicals and the water in the mixing unit, given that in the mixing unit the at least one water line of the water supply unit and the at least two chemical transport lines of the chemical supply unit are connected directly or indirectly and/or via at least one openable and closable shut-off means with a single treatment fluid feed line.

In addition, feed of the aqueous treatment fluid into a treatment chamber by feeding the aqueous treatment fluid into distribution means arranged in the treatment chamber via the single treatment fluid feed line, wherein the aqueous treatment fluid is distributed by means of the distribution means arranged in the treatment chamber onto the semiconductor objects held inside the treatment chamber by holding means.

These method steps allow for the provision of a method for treating semiconductor objects with improved treatment efficiency, sustainability and flexibility. Specifically, the semiconductor objects can be treated with several treatment chemicals simultaneously. The composition of an aqueous treatment fluid can thus be adjusted flexibly and specifically to the respective requirements of a treatment or flushing process. Despite the simultaneous use of multiple treatment chemicals, they or their aqueous solutions can be stored or stockpiled stably with long-term stability. Furthermore, a risk of contamination for a certain aqueous treatment fluid can be effectively prevented because an aqueous treatment fluid with a certain chemical composition is only used once.

Furthermore, the described steps also provide a method with improved time efficiency because several treatment chemicals can be used simultaneously for a certain treatment process and several, sequential treatment and flushing processes can be avoided. Moreover, it can also be ensured that the treatment chemicals contained in the aqueous treatment fluid are well and homogeneously mixed prior to being introduced or distributed into the treatment chamber, such that all of the semiconductor objects held in the treatment chamber can be chemically treated or cleaned in the same manner.

In particular, the disclosed method can be intended for the operation of a treatment device as described above and hereinafter in connection with FIG. 1.

As commonly known in the art, the treatment chamber can be configured as a rotor, for instance, and be rotated around a rotation axis during a treatment process. The distribution means can, for instance, be formed by a plurality of line-connected spray nozzles or sprinklers which can be supplied with a respective aqueous treatment fluid via the single, shared treatment fluid feed line during a treatment process. It is entirely possible for several such line-connected spray nozzles to be arranged as distribution means in the treatment chambers, for instance as spray nozzle rows. These distribution means can then each be line-connected via separate inlets with the single, shared treatment fluid feed line, and thus each of the distribution means in the treatment chamber can be supplied with treatment fluid.

Furthermore, however, it can also be provided that the treatment chamber has other additional distribution means which can be connected with a separate water feed line for feeding in the water provided by means of the water supply unit, in particular deionized water. Following a treatment process with aqueous treatment fluid, the semiconductor objects can thereby be flushed with pure, in particular deionized, water. A corresponding treatment fluid can be discharged following a treatment process via a drain in the treatment chamber.

The at least two chemical containers can be supplied via supply lines with the respective treatment chemicals or aqueous solutions of treatment chemicals from external provision devices.

Similarly, the water supply unit can be supplied with highly pure water, in particular deionized water, by an external water supply means. The water in the water line(s) can be conveyed by means of a water pump in the water supply unit. Alternatively, however, the external water supply means can prime the water at a pre-pressure, for instance by means of an external water pump, such that conveyance by a water pump in the water supply unit can potentially be rendered superfluous.

The respective chemical conveying devices assigned to a chemical container can be configured as chemical pumps. Nonetheless, in very fundamental terms, a different configuration of the chemical conveying devices is also conceivable, for instance as Venturi nozzles. It is, however, also possible to perform conveyance of the treatment chemicals or aqueous solutions of treatment chemicals by pressurizing the chemical containers, for instance with gas.

Furthermore, the conveyance can be performed in the at least two chemical transport lines and the at least one water line which lead into the mixing unit by means of flow control means and flow monitoring means. For example, for flow control, the at least two chemical conveying devices of the chemical supply unit can be configured as flow adjustable, such as speed variable, chemical pumps. Alternatively, dedicated flow control means such as flow control valves can be arranged both in the at least two chemical transport lines and/or the at least one water line. Corresponding mixture ratios and chemical concentrations of an aqueous treatment fluid introduced into the treatment chamber can be configured individually prior to introduction. The respective media flows, i.e. the flows of the treatment chemicals or aqueous solutions of treatment chemicals and of the water, as well as the flow rate of the aqueous treatment fluid through the single treatment fluid feed line, are thus freely selectable parameters and can be selected depending on the circumstance or cleaning requirement. Individual flow rates can also be monitored by means of flow sensors.

All available control means, such as pumps, valves, and sensors of the treatment device can of course also be connected with an electronic control device, such that the method can be performed in an automated manner.

According to a further embodiment of the method, it can be provided that water is fed to the mixing unit via at least two water lines of the water supply unit connected to the mixing unit, wherein upstream of the connection with the single treatment fluid feed line at least one treatment chemical or aqueous solution of a treatment chemical is fed to each of the water lines in the mixing unit.

These steps enable the production of separate, diluted solutions of the treatment chemicals prior to the combination of these aqueous solutions to form the aqueous treatment fluid. Fast kinetic reactions of the treatment chemicals with one another can advantageously be at least delayed prior to introduction into the treatment chamber.

Furthermore, an embodiment of the method can be provided in which at least three different treatment chemicals or aqueous solutions of different treatment chemicals are stored in at least three correspondingly configured chemical containers of the chemical supply unit.

Specifically, this can allow for an increased number of chemicals or treatment chemicals to be provided for a treatment of the semiconductor objects, thus increasing the flexibility of the method.

It can hereby be particularly expedient for the concentrated sulfuric acid to be stored in a first chemical container, an aqueous solution of hydrogen peroxide to be stored in a second chemical container, and diluted hydrofluoric acid to be stored in a third chemical container.

The storage of these treatment chemicals or aqueous solutions of treatment chemicals and their use for treatment is useful because a multitude of treatment and flushing processes following work steps such as etching can be covered with these treatment chemicals or aqueous solutions of treatment chemicals or combinations thereof with one another. For instance, the use of an aqueous treatment fluid comprising a combination of hydrogen peroxide and sulfuric acid has proven effective for the removal of many polymeric contaminations.

Preferably, an embodiment of the method can be provided in which water is fed to the mixing unit via the at least two water lines connected to the mixing unit via the respective opened shut-off means assigned to the at least two water lines, wherein the shut-off means are line-connected with one another downstream such that a shut-off block is formed by the shut-off means, and wherein the treatment fluid formed in the mixing unit is delivered from the shut-off block into the single treatment fluid feed line.

This is advantageous on the one hand because a diluted, aqueous solution can be fed quickly and precisely into the mixing unit. On the other hand, diluted solutions fed to the mixing unit or its shut-off block can be convectively fluidized and thus pre-mixed or homogenized prior to the introduction of the aqueous treatment fluid. That can in turn ensure that all semiconductor objects in the treatment chamber are evenly treated with an aqueous treatment solution with homogeneously admixed treatment chemicals. The at least two treatment chemicals or aqueous solutions of treatment chemicals can, for example, also each be fed to one of the shut-off means.

In this regard, it can, however, also be provided in the method that in the mixing unit only one of the at least two treatment chemicals or aqueous solutions of treatment chemicals is fed out of one of the at least two chemical transport lines upstream of the shut-off block into precisely one of the at least two water lines connected to the mixing unit.

In other words, it can be provided that upstream of the connection with the single treatment fluid feed line or in the mixing unit, one each of the treatment chemicals or aqueous solutions of treatment chemicals is fed to exactly one of the water lines in such a way that multiple treatment chemicals or aqueous solutions of treatment chemicals are not fed to one water line. Above all, these method steps allow for a further improved, precisely controlled production of the aqueous treatment fluid for the treatment of the semiconductor objects in the treatment chamber.

According to a further embodiment of the method, it can be provided that carbon dioxide gas is dosed into the water in at least one water line leading to the mixing unit by means of a dosing unit.

This method step is advantageous because especially due to the resulting carbon dioxide, the water or the aqueous treatment fluid can be rendered less corrosive and thus at least a certain degree of corrosion protection can be provided for the wafers.

Preferably, a method can also be provided in which at least a partial quantity of the water fed to the mixing unit is heated up by means of a heating device prior to feeding to the mixing unit.

By means of this step, a desired working temperature can be conferred upon the aqueous treatment fluid, but also, for instance, upon the flushing water fed separately into the treatment chamber, in particular deionized flushing water. Cleaning processes can be advantageously accelerated by an increased temperature, thereby enabling shorter treatment and flushing processes and thus shorter treatment durations. For instance, to heat the water, the water in the water supply unit can be fed to the heating means via a bypass line of the water supply unit running parallel to a main water line and subsequently be guided back into the main water line. For this purpose, a 3-way switching means or valve, or a 3-way control means or valve, can be arranged in the main water line, thus enabling the targeted diversion of the supplied water, in particular the deionized water, via the heating means to heat the water. Alternatively, combinations of 2-way switching or control means can of course be used instead of 3-way variants. Where control means or valves are used, only a partial amount of the water supplied to the water supply unit can be heated by the heating device arranged in the bypass line.

In addition, a further embodiment of the method can be advantageous in which the at least two treatment chemicals or aqueous solutions of treatment chemicals are pumped cyclically into the respective assigned chemical container by means of the chemical conveying devices via 3-way switching device assigned to the respective at least two chemical containers and via the bypass lines returning or leading back to the respective assigned chemical container, and the at least two treatment chemicals or aqueous solutions of treatment chemicals to be used for the treatment of semiconductor objects in the treatment chamber are fed to the mixing unit by means of the at least two chemical conveying devices via the at least two chemical transport lines, by switching the 3-way switching devices.

These method steps allow for very fast control of the feed of treatment chemicals or aqueous solutions of treatment chemicals to the mixing unit. Consequently, a treatment chemical for the production of the aqueous treatment fluid can thereby be provided very quickly, and it is therefore also possible to switch very quickly from one composition of an aqueous treatment fluid to a treatment fluid with another composition or other treatment chemicals. This is possible because the individual treatment chemicals or aqueous solutions of treatment chemicals are already circulated prior to being fed to the mixing unit, and do not first have to be put into circulation. For instance, a 3-way switching device can be implemented using a 3-way switching means or valve or a combination of two 2-way switching means or valves, with one 2-way switching means in the chemical transport line and one 2-way switching means in the bypass line which leads back to a chemical container. In particular, 3-way switching devices can be formed by 3-way control valves or combinations of two 2-way control valves in order to enable control of the respective flow or the quantity fed to the mixing unit via the chemical transport lines.

BRIEF DESCRIPTION OF THE DRAWINGS

Other objects and features of the invention will become apparent from the following detailed description considered in connection with the accompanying drawings. It is to be understood, however, that the drawings are designed as an illustration only and not as a definition of the limits of the invention.

In the Drawings, in Significantly Simplified, Schematic Representation:

The sole FIGURE shows an example embodiment of a treatment device for treating or cleaning semiconductor objects.

DETAILED DESCRIPTION OF PREFERRED EMBODIMENTS

It is worth noting here that the same parts have been given the same reference numerals or same component configurations in the embodiments described hereinafter, yet the disclosures contained throughout the entire description can be applied analogously to the same parts with the same reference numerals or the same component configurations. The indications of position selected in the description, such as above, below, upstream or downstream etc. refer to the FIGURE directly described and shown, and these indications of position can be applied in the same way to the new position should the position change.

The sole FIGURE shows a rough schematic representation of an example embodiment of a treatment device 1 for treating semiconductor objects 2 with an aqueous treatment fluid along with a method for treating semiconductor objects 2 with an aqueous treatment fluid. The treatment device 1 is configured for the treatment of the semiconductor objects 2. In particular, the treatment device 1 can be provided to use the aqueous treatment fluid to clean the semiconductor objects 2 of contaminations or residues caused by previous processing steps. The treatment device 1 can thus also be designated as a cleaning device or as a device for cleaning semiconductor objects with the aqueous treatment fluid.

As can be seen in the sole FIGURE, the treatment device 1 has a treatment chamber 3. Holding means 4 for holding the semiconductor objects 2 are arranged inside the treatment chamber 3. Furthermore, distribution means 5 for distributing the aqueous treatment fluid onto the semiconductor objects 2 held in the treatment chamber 3 are arranged in the treatment chamber 3.

As is known in the art, the treatment chamber 3 can be configured as a rotor that rotates around a rotation axis, as shown in the sole FIGURE. Such a rotor can be mounted rotatably and be connected with a corresponding rotary drive, not shown in the sole FIGURE. The distribution means 5 shown schematically in the sole FIGURE can, for instance, be formed by a plurality of line-connected spray nozzles or sprinklers, although the sole FIGURE only shows one such distribution means 5. Furthermore, the treatment chamber 3 can, as is common in the art, have a drain 6 or several drains 6 to drain off fluids. The semiconductor objects can, as also shown roughly in the sole FIGURE, be formed by semiconductor wafers.

The treatment device 1 according to the example embodiment in the sole FIGURE also has a supply device 7 for feeding the distribution means 5 in the treatment chamber 3 with the aqueous treatment fluid.

This supply device 7 comprises, on the one hand, a chemical supply unit 8 with at least two chemical containers 9, 10, 11. According to the example embodiment shown in the sole FIGURE the chemical supply unit 8 can have three chemical containers 9, 10, 11, although fewer or more chemical containers 9, 10, 11 than in the example embodiment shown can of course be provided. In any case, the chemical containers 9, 10, 11 are each configured to store at least two different treatment chemicals or aqueous solutions of different treatment chemicals. In the example embodiment shown in the sole FIGURE, it can, for example, be provided that a first chemical container 9 is configured for storing concentrated sulfuric acid ($H_2SO_4$), that is to say approx. 95% sulfuric acid. A second chemical container 10 can, for example, be configured for storing an aqueous solution of hydrogen peroxide ($H_2O_2$), i.e. an approx. 30% solution of hydrogen peroxide. A third chemical container 11 in the example embodiment according to the sole FIGURE can then be configured for storing diluted hydrofluoric acid (HF), for example approx. 1% hydrofluoric acid.

The at least two or all available chemical containers 9, 10, 11 can, as shown in the sole FIGURE, be configured with supply lines 12 for feeding in the respective treatment chemicals or aqueous solutions of treatment chemicals. For this purpose, the supply lines 12 can be connected with external provision devices for the treatment chemicals or aqueous solutions of treatment chemicals, not shown in more detail in the sole FIGURE. As further shown in the sole FIGURE, a chemical transport line 13, 14, 14 and a chemical conveying device 16, 17, 18 for retrieving the treatment chemicals or the aqueous solutions of treatment chemicals is assigned downstream to each of the chemical containers 9, 10, 11, that is to say to the three chemical containers 9, 10, 11 in the example embodiment shown. The chemical conveying devices 16, 17, 18 respectively assigned to a chemical container 9, 10, 11 can be formed by chemical pumps, as also shown schematically in the sole FIGURE. In very fundamental terms, however, a different configuration of the chemical conveying devices 16, 17, 18 is also possible, for example as Venturi nozzles or any conveying devices suited for the transport or conveyance of the treatment chemicals or aqueous solutions of treatment chemicals along the chemical transport lines. For instance, a pressurization of the chemical containers 9, 10, 11, such as using a gas, is thus entirely conceivable, such that the chemical conveying devices 16, 17, 18 can also be formed by corresponding pressurization means.

The supply device 7 of the treatment device 1 further comprises a water supply unit 19 for the provision of water, in particular of deionized water. This water supply unit 19 has at least one water line 20, 21, 22 for conducting the water. Like the chemical containers 9, 10, 11, the water supply unit 19 can also be connected with an external water supply means for highly pure water, in particular deionized water, for example via a water supply line 23 as shown in the sole FIGURE. For example, the water supply unit 19 can fundamentally have a water pump for conveying the water in the water line(s) 20, 21, 22. Alternatively, however, the external water supply means can prime the water at a pre-pressure via a or the water supply line 23, for instance by means of an external water pump, such that a water pump is potentially rendered superfluous for the water supply unit, as is also indicated in the sole FIGURE.

As further shown schematically in the sole FIGURE, the chemical transport lines 13, 14, 15 of the chemical supply unit 8 are directly or indirectly connected with a single treatment fluid feed line 24. In turn, this single treatment fluid feed line 24 is line-connected with the distribution means 5 arranged in the treatment chamber 3. Naturally, several such distribution means 5 can be arranged in the treatment chamber 3 which can be line-connected with the single, shared treatment fluid feed line 24 for the purpose of supplying aqueous treatment fluid via respective separate feed lines.

Fundamentally, it can be provided here, for example, that the at least two chemical transport lines 13, 14, 15 or all or each of the chemical transport lines 13, 14, 15 and the at least one water line 20, 21, 22 are directly connected with the single treatment fluid feed line 24. According to a simple embodiment of the supply device 7, it can, for instance, be provided that the at least two chemical transport lines 13, 14, 15 initially lead into the at least one water line 20, 21, 22, where downstream said at least one water line 20, 21, 22 can in turn lead directly into the single treatment fluid feed line 24. In such a case, the at least two chemical transport lines 13, 14, 15 can thus be indirectly connected with the treatment fluid feed line 24. Other embodiments of direct or indirect connections of the chemical transport lines 13, 14, 15 and the water line(s) 20, 21, 22 with the single treatment fluid feed line 24 are, however, of course also conceivable.

It can also be provided that the at least two chemical transport lines 13, 14, 15 or all or each of the chemical transport lines 13, 14, 15 of the chemical supply unit 8 and the at least one water line 20, 21, 22 of the water supply unit 19 are connected with the single treatment fluid feed line 24 via at least one openable and closable shut-off means 25, 26, 27, as is the case in the example embodiment shown in the sole FIGURE. In any case, due to the fact that the at least two chemical transport lines 13, 14, 15 of the chemical supply unit 8 and the at least one water line 20, 21, 22 of the water supply unit 19 are connected with the single treatment fluid feed line 24, a mixing unit 28 is formed.

Furthermore, it can be provided that in the supply device 7, the water supply unit 19 has at least two water lines 20, 21, 22 connected to the mixing unit 28, wherein upstream of the connection with the single treatment fluid feed line 24 each of the water lines 20, 21, 22 is connected with at least one chemical transport line 13, 14, 15.

In the example embodiment shown in the sole FIGURE, it can preferably and specifically be provided that in the mixing unit 28, each of the water lines 20, 21, 22 connected to the mixing unit 28 leads into an openable and closable shut-off means 25, 26, 27, said shut-off means 25, 26, 27 being line-connected with one another downstream such that the shut-off means 25, 26, 27 form a shut-off block 29, wherein the single treatment fluid feed line 24 is line-connected with this shut-off block 29.

Furthermore, as shown in the sole FIGURE, a number of the water lines 20, 21, 22 connected to the mixing unit 28 can equal the number of chemical transport lines 13, 14, 15 connected to the mixing unit 28. With supply device 7, it can thereby be provided that in the mixing unit 28 only one chemical transport line 13, 14, 15 leads to exactly one of the water lines 20, 21, 22 connected to the mixing unit 28.

In the preferred example embodiment of a treatment device 1 as shown in the sole FIGURE, each one of the in this case three chemical transport lines 13, 14, 15 can lead to exactly one of the three water lines 20, 21, 22 connected to the mixing unit 28. In the example embodiment shown, the three chemical transport lines 13, 14, 15 can lead to a respective water line 20, 21, 22, upstream of the respective shut-off block 29, as also shown.

As further shown in the sole FIGURE, the at least two chemical containers (9, 10, 11) can each have a 3-way switching device (30) and each have a bypass line (31) returning to the respective chemical container (9, 10, 11) assigned to them. The 3-way switching devices can, as shown in the sole FIGURE, for example, be formed by 3-way switching means or valves. Alternatively, the 3-way switching devices 30 can of course also be configured as a combination of two 2-way switching means or valves, with one 2-way switching means in the chemical transport line and one 2-way switching means in the bypass line 31 which leads back to a chemical container.

In very general terms, for the improved control of flow rates of fluid media or fluids in the supply device, flow control means can be assigned to or arranged in the at least two chemical transport lines 13, 14, 15 and the at least one water line 20, 21, 22. For example, the chemical conveying devices 16, 17, 18 shown in the sole FIGURE can be configured as flow adjustable, such as speed variable, chemical pumps. Alternatively and/or additionally, for this purpose the 3-way switching devices 30 as also shown in the sole FIGURE can be configured as regulating or 3-way control valves in order to be able to regulate the amount of treatment chemical or aqueous solution of treatment chemical fed to the respective chemical transport line 13, 14, 15 per time unit. Other flow control means 32 or flow regulators, such as flow valves, can also be used for this purpose. In the example embodiment of a treatment device 1 as shown in the sole FIGURE, for example, such flow control means 32 are shown in a main water line 33 of the water supply unit 19.

Furthermore, flow sensors 34 can be arranged in the fluid lines 13, 14, 15, 20, 21, 22, 23, 24, 33 for the monitoring and control of flow rates, as is also shown in the sole FIGURE. For the purpose of further process surveillance during operation of the treatment device 1, additional pressure sensors 35 and temperature sensors can, however, be assigned to the various fluid lines 13, 14, 15, 20, 21, 22, 23, 24, 33.

All of the flow control means 16, 17, 18, 30, 32 mentioned as options as well as all mentioned monitoring means 34, 35, 36 can of course also be electronically controllable and can have a signal technology connection with a control device not shown in more detail in the sole FIGURE, in order to enable a partially or fully automated, electronic control of the treatment device 1 components. The same also applies for the flow control means and sensors described in the following.

As further shown in the sole FIGURE, the supply device 7 of the treatment device 1 can also comprise a separate water feed line 37 for feeding pure water, in particular pure, deionized water, into the treatment chamber 3. For the flushing of the semiconductor objects 2 in the treatment chamber 3 with pure water, the treatment chamber 3 can have additional, separate distribution means 38 which can, for example, be connected with the separate water feed line 37 as shown in the sole FIGURE. Alternatively, it would of course also be possible for the separate water line 37 shown in the sole FIGURE to be connected with the same distribution means 5 as are also connected with the treatment fluid feed line.

As can be seen in the sole FIGURE, all water lines 20, 21, 22 leading into the mixing unit 28 can branch off from the aforementioned main water line 33. The water feed line 37 shown additionally in the sole FIGURE can also branch off from this main water line 33.

The fluid lines 13, 14, 15, 20, 21, 22, 23, 24, 33 shown in the sole FIGURE can fundamentally be formed by rigid pipes or flexible tubes, although it must of course be ensured that the material selected for a fluid line 13, 14, 15, 20, 21, 22, 23, 24, 33 has an appropriate chemical resistance against the respective chemicals contained in the treatment chemicals in the line. All line branches and line outlets described above or present in the treatment device 1 can be configured in any way known in the art, such as using corresponding connectors, such as conventional T-connectors.

As can be seen in the example embodiment shown in the sole FIGURE, the supply device 7 can further comprise a dosing unit 39 for the dosed feeding of carbon dioxide gas ($CO_2$) into the at least one water line 20, 21, 22, 33 leading to the mixing unit 28. The dosing unit 39 can thereby be connected with an external carbon dioxide gas supply means via a carbon dioxide gas supply line 40 via a gas shut-off valve 41. In turn, a carbon dioxide gas supply line 42 can lead into the at least one water line 20, 21, 22, 33 leading to the mixing unit 28, such as into the main water line in accordance with the example embodiment shown in the sole FIGURE. The dosing unit 39 can further comprise a gas pressure control valve 43 for the targeted metering of carbon dioxide, and a gas flow control means 44 for setting a certain desired carbon dioxide flow rate. In addition, a gas pressure sensor 45 can be provided for monitoring carbon dioxide pressure in the dosing unit 39. For the purposes of controlling carbon dioxide flow rate, a conductivity sensor 46 can be arranged in the at least one water line 20, 21, 22, 23 leading to the mixing unit 28, into which the carbon dioxide feed line 42 leads. The carbon dioxide flow rate can be controlled by means of the gas flow control means 44 on the basis of the measurements from this conductivity sensor 46.

The water supply unit 19 of the supply device 7 can further comprise a heating device 47 for heating the water, in particular the deionized water, as can be seen in the sole FIGURE. As can be seen in the sole FIGURE, such a heating device can, for example, be arranged in a water bypass line 48 of the water supply unit running parallel to the main water line 33. Furthermore, a 3-way switching means 49 or valve, in particular a 3-way control means or valve, can be arranged in the main water line. Alternatively, a combination of two switching means, one in the main water line 33 and one in the water bypass line 28, would of course also be conceivable. For example, the heating device 47 can, as is known in the art, have electrically heatable heating cartridges for heating the water, in particular the deionized water.

An example embodiment of the method is described in the following. The treatment device 1 described above can be provided for the performance of the method. Conversely, the method can be provided for the operation of the treatment device 1. Accordingly, the means, elements and devices for performing the method are already described above in the description of the treatment device, and reference is hereby made to the aforementioned description of the treatment device 1 for the following description of the method.

The method for treating semiconductor objects 2 with an aqueous treatment fluid comprises the following method steps:

Storage of at least two different treatment chemicals or aqueous solutions of different treatment chemicals in at least two correspondingly configured chemical containers 9, 10, 11 of a chemical supply unit 8, as also shown in the sole FIGURE.

Furthermore, the method comprises a provision of water, in particular deionized water by means of a water supply unit 19, wherein at least one water line 20, 21, 22 of the water supply unit 19 is connected to a mixing unit 28 of the supply device 7, and feed of the water to or into the mixing unit 28 by means of this at least one water line 20, 21, 22 connected to the mixing unit.

In addition, the method comprises a retrieval of or from the at least two treatment chemicals or aqueous solutions of treatment chemicals from the at least two chemical containers 9, 10, 11 and supply of the at least two treatment chemicals or aqueous solutions of treatment chemicals to the mixing unit 28 by means of at least two chemical transport lines 13, 14, 15 and at least two chemical conveying devices 16, 17, 18, said at least two chemical transport lines 13, 14, 15 each being assigned upstream to the at least two chemical containers 9, 10, 11, and said at least two chemical conveying devices each being assigned to the at least two chemical containers 13, 14, 15.

Furthermore, the method comprises a formation of the aqueous treatment fluid by combining the at least two treatment chemicals or aqueous solutions of treatment chemicals and the water in the mixing unit 28. According to a simple procedure, the aqueous treatment fluid can be formed in such a way that in the mixing unit 28 the at least one water line 20, 21, 22 of the water supply unit 19 and the at least two chemical transport lines 13, 14, 15 of the chemical supply unit 8 are directly or indirectly connected with a single treatment fluid feed line 24, for example the at least two treatment chemicals or aqueous solutions of treatment chemicals are simply fed to the water conducted in the at least one water line 20 and subsequently the treatment chemicals thus diluted are fed to the single treatment fluid feed line 24. It is, however, alternatively or additionally possible that, as can be seen in the sole FIGURE, the aqueous treatment fluid is formed in the mixing unit 28 in such a way that the at least one water line 20, 21, 22 of the water supply unit 19 and the at least two chemical transport lines 13, 14, 15 of the chemical supply unit 8 are connected with the single treatment fluid feed line 24 via at least one openable and closable shut-off means 25.

As further shown in the sole FIGURE, the method also entails the feed of the aqueous treatment fluid to a treatment chamber 3 by feeding the aqueous treatment fluid to distribution means 5 arranged in the treatment chamber 3 by means of the single treatment fluid line(s) 24. The aqueous treatment fluid is thereby distributed via the distribution means 5 arranged in the treatment chamber 3 onto the semiconductor objects 2 held inside the treatment chamber 3 by holding means 4. Of, course, several distribution means 5 can be provided for here, wherein the aqueous treatment fluid can be fed to each of these several distribution means 5 from the single treatment fluid feed line 24 via respectively separate supply lines, via which the treatment fluid feed line 24 can be indirectly line-connected with the distribution means 5.

The method can be provided in particular for cleaning the semiconductor objects 2 from contaminations or residues caused by previous processing steps with the aqueous treatment fluid and can also be designated as a treatment and cleaning method.

The given or prevailing media flows or their flow directions in the method, such as the flow directions of the at least two treatment chemicals or aqueous solutions of treatment chemicals and the water, are shown schematically in the sole FIGURE by the arrows.

The treatment chamber 3 can, as already explained above, be configured as a rotor, and in such a case can rotate around a rotation axis during the treatment of the semiconductor objects 2 with the aqueous treatment fluid formed in the mixing unit 28. The aqueous treatment fluid can be drained off from the treatment chamber 3 after treatment of the semiconductor objects 2 via a drain 6 or several drains 6.

The at least two treatment chemicals or aqueous solutions of treatment chemicals can each be fed to the at least two chemical containers 9, 10, 11 for storage via a supply line 12. The water, in particular the deionized water, can also be provided to the water supply unit 19 via a water supply line 23 from an external water source, as can be seen in the sole FIGURE.

According to one method version, it can be provided that water is fed to the mixing unit 28 by means of two water lines 20, 21, 22 of the water supply unit 19 connected to the mixing unit. Further upstream of the connection with the single treatment fluid feed line 24, at least one treatment chemical or aqueous solution of a treatment chemical can hereby be fed to each of the water lines 20, 21, 22 as is also the case in the example embodiment shown in the sole FIGURE.

According to the example embodiment shown in the sole FIGURE, at least three different treatment chemicals or aqueous solutions of different treatment chemicals can be stored in at least three correspondingly configured chemical containers 9, 10, 11 of the chemical supply unit 8.

For example, according to an expedient variation of the method, it can be provided that concentrated sulfuric acid is stored in a first chemical container 9, an aqueous solution of hydrogen peroxide is stored in a second chemical container 10, and diluted hydrofluoric acid is stored in a third chemical container 11. Expediently, these treatment chemicals or in particular combinations of at least two of these treatment chemicals or aqueous solutions of these treatment chemicals can be used for the formation of the aqueous treatment fluid and ultimately for the treatment or cleaning of the semiconductor objects 2 in the treatment chamber 3.

According to a preferred method version, the water can be fed to the mixing unit 28 via the at least two water lines 20, 21, 22 connected to the mixing unit 28 via the respective opened shut-off means 25, 26, 27 assigned to the at least two water lines 20, 21, 22. The shut-off means 25, 26, 27 can thereby be line-connected with one another downstream such that the shut-off means 25, 26, 27 form a shut-off block, as is illustrated in the sole FIGURE. The treatment fluid formed in the mixing unit 28 can then be delivered into the single treatment fluid feed line 24 from this shut-off block 29.

In this regard, as shown in the sole FIGURE it can be provided in the method that in the mixing unit 28 only one of the at least two treatment chemicals or aqueous solutions of treatment chemicals is fed out of one of the at least two chemical transport lines 13, 14, 15 upstream of the shut-off block 29 into precisely one of the at least two water lines 20, 21, 22 connected to the mixing unit 28.

According to a further preferred method version, it can also be provided that prior to their use for treating the semiconductor objects 2 in the treatment chamber 3, the at least two treatment chemicals or aqueous solutions of treatment chemicals are pumped cyclically into the respective assigned chemical container 9, 10, 11 by means of the chemical conveying devices 16, 17, 18 via 3-way switching devices 30 assigned to the respective at least two chemical containers 9, 10, 11 and via the bypass lines 31 returning to the respective assigned chemical container 9, 10, 11, as is also shown in the sole FIGURE. Only when a treatment process for treating or cleaning the semiconductor objects 2 in the treatment chamber 3 is to be started can the at least two treatment chemicals or aqueous solutions of treatment chemicals for use for treating the semiconductor objects 2 in the treatment chamber 3 be fed to the mixing unit 28 via the at least two chemical conveying devices 16, 17, 18 via the at least two chemical transport lines 13, 14, 15, by switching the 3-way switching devices 31.

As further shown in the sole FIGURE, in order to flush the semiconductor objects 2 in the treatment chamber 3 with pure water, for example after treatment processes with the aqueous treatment fluid, pure water can be supplied to or fed to the treatment chamber 3 via a separate water feed line 37 of the supply device. The water, in particular deionized water, can hereby be fed to the treatment chamber via additional or separate distribution means 38 connected with the separate water feed line 37. Alternatively, it would also of course be possible to feed in pure water via the same distribution means 5 as used to introduce the aqueous treatment fluid into the treatment chamber 3.

Furthermore, in this method it can be expedient to dose carbon dioxide gas into the water in at least one of the water lines 20, 21, 22, 33 leading to the mixing unit by means of a dosing unit 39. As shown in the sole FIGURE, carbon dioxide gas from an external carbon dioxide gas supply means can be fed to the dosing unit 39 via a carbon dioxide gas supply line. The thus fed gas can then be fed to the at least one water line 20, 21, 22, 33 leading to the mixing unit 28, in the example embodiment in the sole FIGURE the main water line 33, via a carbon dioxide gas supply line 42. The dosing of the carbon dioxide gas can hereby be performed by means of the gas flow control means 44 shown in the sole FIGURE. As also shown in the sole FIGURE, a conductivity of the water can be determined by means of a conductivity sensor 46 in the at least one water line 20, 21, 22, 33 leading to the mixing unit 28 and the carbon dioxide flow rate can be controlled by means of the gas flow control means 44 on the basis of the conductivity measuring data obtained.

According to a further, preferred embodiment of the method, it can also be provided that at least a partial quantity of the water fed to the mixing unit 28 is heated up by means of a heating device 47 prior to being fed to the mixing unit 28. For this purpose, as can be seen in the sole FIGURE, the entire water or only a partial quantity of the water can be fed via the water bypass line 48 of the heating device running parallel to the main water line by means of the 3-way switching means 49 described above, wherein or with which the water can be heated before it is fed to the mixing unit.

Various measurement parameters, such as flow rates, temperatures or pressures, can be determined by means of sensors for the control and monitoring of the method steps described. Examples for the use of expedient sensors are already provided above in the description of the treatment device 1, and reference is hereby made to the description above. Of course, the automated control of any method-related aspects which involves controllable devices, means and sensors can be performed in a manner known in the art by means of an electronic control device not shown in the sole FIGURE.

The example embodiments show possible embodiment variations, although it is to be noted here that the invention is not limited to the specifically represented embodiment variations of the same, but rather various combinations of the individual embodiment variations with one another are possible, and that given the technical teachings provided by the present invention this variation possibility is within the ability of the skilled person in this technical field.

The scope of protection is defined by the claims. The description and the drawings should, however, be consulted when construing the claims. Individual features or combinations of features from the various example embodiments as shown and described can constitute separate inventive solutions. The problem to be solved by the individual inventive solutions can be derived from the description.

All value ranges specified in the current description are to be understood such that they include any and all sub-ranges, e.g., the specification 1 to 10 is to be understood such that all sub-ranges, starting from the lower limit 1 and the upper limit 10 are included, i.e., all sub-ranges begin with a lower limit of 1 or more and end at an upper limit of 10 or less, e.g., 1 to 1.7, or 3.2 to 8.1, or 5.5 to 10.

As a matter of form and by way of conclusion, it is noted that, to improve understanding of the structure, elements have partially not been shown to scale and/or enlarged and/or shrunk.

Although only a few embodiments of the present invention have been shown and described, it is to be understood that many changes and modifications may be made thereunto without departing from the spirit and scope of the invention.

LIST OF REFERENCE NUMERALS

1 Treatment device
2 Semiconductor object
3 Treatment chamber
4 Holding means
5 Distribution means
6 Drain
7 Supply device
8 Chemical supply unit
9 Chemical container
10 Chemical container
11 Chemical container
12 Supply line
13 Chemical transport line
14 Chemical transport line
15 Chemical transport line
16 Chemical conveying device
17 Chemical conveying device
18 Chemical conveying device
19 Water supply unit
20 Water line
21 Water line
22 Water line
23 Water supply line
24 Treatment fluid feed line
25 Shut-off means
26 Shut-off means
27 Shut-off means
28 Mixing unit
29 Shut-off block
30 3-way switching device
31 Bypass line
32 Flow control means
33 Main water line
34 Flow sensor
35 Pressure sensor
36 Temperature sensor
37 Water feed line
38 Distribution means
39 Dosing unit
40 Carbon dioxide gas supply line
41 Gas shut-off valve
42 Carbon dioxide feed line
43 Gas pressure control valve
44 Gas flow control valve
45 Gas pressure sensor
46 Conductivity sensor
47 Heating device
48 Water bypass line
49 3-way switching means

What is claimed is:

1. A treatment device (1), configured for the treatment of semiconductor objects (2) with an aqueous treatment fluid, comprising a treatment chamber (3) with holding means (4) arranged inside the treatment chamber (3) for holding semiconductor objects (2) and with distribution means (5) arranged in the treatment chamber (3) for the distribution of the aqueous treatment fluid onto the semiconductor objects (2) held in the treatment chamber (3)

a supply device (7) for feeding the distribution means (5) in the treatment chamber (3) with the aqueous treatment fluid, wherein the distribution means (7) comprises, a chemical supply unit (8) with at least two chemical containers (9, 10, 11), configured for storing at least two different treatment chemicals or aqueous solutions of different treatment chemicals, wherein each of the chemical containers (9, 10, 11) has a downstream chemical transport line (13, 14, 15) and a chemical conveying device (16, 17, 18) for retrieving the treatment chemicals or the aqueous solutions of treatment chemicals assigned to it, and a water supply unit (19) for the provision of water, in particular deionized water, wherein the water supply unit (19) has at least one water line (20, 21, 22) for conducting water, wherein the at least one water line (20, 21, 22) of the water supply unit (19) and the chemical transport lines (13, 14, 15) of the chemical supply unit (8) are connected directly or indirectly and/or via an openable and closable shut-off means (25, 26, 27) with a single treatment fluid feed line (24), and a mixing unit (28) is thereby formed, wherein the single treatment fluid feed line (24) is line-connected with the distribution means (5) arranged in the treatment chamber (3).

2. The treatment device (1) according to claim 1, wherein the water supply unit (19) has at least two water lines (20, 21, 22) connected to the mixing unit (28), wherein upstream of the connection with the single treatment fluid feed line (24) each of the water lines (20, 21, 22) is connected with at least one chemical transport line (13, 14, 15).

3. The treatment device (1) according to claim 1, wherein the chemical supply unit (8) comprises at least three chemical containers (9, 10, 11).

4. The treatment device (1) according to claim 3, wherein a first chemical container (9) is configured for storing concentrated sulfuric acid, a second chemical container (10) is configured for storing hydrogen peroxide, and a third chemical container (11) is configured for storing diluted hydrofluoric acid.

5. The treatment device (1) according to claim 2, wherein in the mixing unit (28), each of the water lines (20, 21, 22) connected to the mixing unit (28) leads into an openable and closable shut-off means (25, 26, 27), said shut-off means (25, 26, 27) being line-connected with one another downstream such that the shut-off means (25, 26, 27) form a shut-off block (29), wherein the single treatment fluid feed line (24) is line-connected with this shut-off block (29).

6. The treatment device (1) according to claim 2, wherein a number of the water lines (20, 21, 22) connected to the mixing unit (28) equals the number of chemical transport lines (13, 14, 15) connected to the mixing unit (28), wherein in the mixing unit (28) each chemical transport line (13, 14, 15) leads to exactly one of the water lines (20, 21, 22) connected to the mixing unit (28).

7. The treatment device (1) according to claim 1, wherein the supply device (7) further comprises a dosing unit (39) for the dosed feeding of carbon dioxide gas into at least one water line (20, 21, 22, 33) leading to the mixing unit (28).

8. The treatment device (1) according to claim 1, wherein the water supply unit (19) further comprises a heating device (47) for heating the water, in particular the deionized water.

9. The treatment device (1) according to claim 1, wherein the at least two chemical containers (9, 10, 11) each have a 3-way switching device (30) and each have a bypass line (31) returning to the respective chemical container (9, 10, 11) assigned to them.

10. A method for treating semiconductor objects (2) with an aqueous treatment fluid, comprising storing at least two different treatment chemicals or aqueous solutions of different treatment chemicals in at least two correspondingly configured chemical containers (9, 10, 11) of a chemical supply unit (8), providing water, in particular deionized water by means of a water supply unit (19), wherein at least one water line (20, 21, 22) of the water supply unit (19) is connected to a mixing unit (28) of the supply device (7) and the water is fed to the mixing unit (28) by means of this at least one water line (20, 21, 22) connected to the mixing unit, retrieval of the at least two treatment chemicals or aqueous solutions of treatment chemicals from the at least two chemical containers (9, 10, 11) and feed of the at least two treatment chemicals or aqueous solutions of treatment chemicals to the mixing unit (28) by means of at least two chemical transport lines (13, 14, 15) and at least two chemical conveying devices (16, 17, 18), said two chemical transport lines (13, 14, 15) respectively being assigned downstream to the at least two chemical containers (13, 14, 15), and said at least two chemical conveying devices being assigned respectively to the at least two chemical containers (13, 14, 15, formation of the aqueous treatment fluid by combining the at least two treatment chemicals or aqueous solutions of treatment chemicals and the water in the mixing unit (28), such that in the mixing unit (28) the at least one water line (20, 21, 22) of the water supply unit (19) and the at least two chemical transport lines (13, 14, 15) of the chemical supply unit (8) are connected directly or indirectly and/or via at least one openable and closable shut-off means (25) with a single treatment fluid feed line (24), and feeding of the aqueous treatment fluid into a treatment chamber (3) by guiding the aqueous treatment solution to distribution means (5) arranged in the treatment chamber (3) via the single treatment fluid feed line (24), wherein the aqueous treatment fluid is distributed via the distribution means (5) arranged in the treatment chamber (3) onto the semiconductor objects (2) held inside the treatment chamber (3) by holding means (4).

11. The method according to claim 10, wherein water is fed to the mixing unit (28) via at least two water lines (20, 21, 22) of the water supply unit (19) connected to the mixing unit (28), wherein upstream of the connection with the individual treatment fluid feed line (24) at least one treatment chemical or aqueous solution of a treatment chemical is fed to each of the water lines (20, 21, 22).

12. The method according to claim 10, wherein at least three different treatment chemicals or aqueous solutions of different treatment chemicals are stored in at least three correspondingly configured chemical containers (9, 10, 11) of the chemical supply unit (8).

13. The method according to claim 12, wherein concentrated sulfuric acid is stored in a first chemical container (9), an aqueous solution of hydrogen peroxide is stored in a second chemical container (10), and diluted hydrofluoric acid is stored in a third chemical container (11).

14. The method according to claim 11, wherein water is fed to the mixing unit (28) via the at least two water lines (20, 21, 22) connected to the mixing unit (28) via respective opened shut-off means (25, 26, 27) assigned to the at least two water lines (20, 21, 22), wherein the shut-off means (25, 26, 27) are line-connected with one another downstream such that a shut-off block (29) is formed by the shut-off means (25, 26, 27), and wherein the treatment fluid formed in the mixing unit (28) is delivered from the shut-off block (29) into the single treatment fluid feed line (24).

15. The method according to claim 14, wherein in the mixing unit (28) only one of the at least two treatment chemicals or aqueous solutions of treatment chemicals is fed out of one of the at least two chemical transport lines (13, 14, 15) upstream of the shut-off block (29) into precisely one of the at least two water lines (20, 21, 22) connected to the mixing unit (28).

16. The method according to claim 10, wherein carbon dioxide gas is dosed into the water in at least one water line (20, 21, 22, 33) leading to the mixing unit by means of a dosing unit (39).

17. The method according to claim 10, wherein at least a partial quantity of the water fed to the mixing unit (28) is heated up by means of a heating device (47) prior to being fed to the mixing unit (28).

18. The method according to claim 10, wherein prior to their use for treating the semiconductor objects (2) in the treatment chamber (3), the at least two treatment chemicals or aqueous solutions of treatment chemicals are pumped cyclically into the respective assigned chemical container (9, 10, 11) by means of the chemical conveying devices (16, 17, 18) via 3-way switching devices (30) assigned to the respective at least two chemical containers (9, 10, 11) and via the bypass lines (31) returning to the respective assigned chemical container (9, 10, 11), and the at least two treatment chemicals or aqueous solutions of treatment chemicals to be used for the treatment of semiconductor objects (2) in the treatment chamber (3) are fed to the mixing unit (28) by means of the at least two chemical conveying devices (16, 17, 18) via the at least two chemical transport lines (13, 14, 15), by switching the 3-way switching devices (31).

* * * * *